United States Patent [19]

Serizawa

[11] Patent Number: 4,778,256
[45] Date of Patent: Oct. 18, 1988

[54] PROCESS FOR PRODUCING OPTICAL ELEMENT

[75] Inventor: Takashi Serizawa, Yokohama, Japan

[73] Assignee: Canon Kabushiki Kaisha, Tokyo, Japan

[21] Appl. No.: 791,401

[22] Filed: Oct. 25, 1985

[30] Foreign Application Priority Data

Oct. 27, 1984 [JP] Japan .................. 59-225110

[51] Int. Cl.⁴ .................. G02B 27/00; G02B 3/00; G03C 1/66
[52] U.S. Cl. .................. 350/320; 350/417; 350/413; 350/96.31; 430/2
[58] Field of Search .................. 350/320, 413, 417, 1.1, 350/1.2, 354, 96.29, 96.12, 96.3, 96.31; 427/35, 38, 42, 43.1, 166, 167, 227, 228; 430/927, 932, 2

[56] References Cited

U.S. PATENT DOCUMENTS

| | | | |
|---|---|---|---|
| 3,486,808 | 12/1969 | Hamblen | 350/413 |
| 3,542,536 | 11/1970 | Flam et al. | 350/413 |
| 3,729,253 | 4/1973 | Moore et al. | 350/413 |
| 4,296,143 | 10/1981 | Franken et al. | 350/417 |
| 4,332,879 | 6/1982 | Pastor et al. | 427/166 |
| 4,687,720 | 8/1987 | Wreede et al. | 430/2 |

*Primary Examiner*—John K. Corbin
*Assistant Examiner*—Loha Ben
*Attorney, Agent, or Firm*—Fitzpatrick, Cella, Harper & Scinto

[57] ABSTRACT

A process for producing optical elements comprises the steps of (a) causing a porous transparent base material to hold a photo-decomposable compound which will be decomposed by light irradiation and can make a change in an optical property of the base material in response to the concentration of the photolysis product or compound originated therefrom, and (b) irradiating the resulting base material with rays of light, thereby decomposing the compound in proportion to the exposure quantity decreasing in the light transmission direction, to form a distribution of the concentration of the photolysis product or compound originated therefrom changing in that direction, in the base material.

42 Claims, 1 Drawing Sheet

PROCESS FOR PRODUCING OPTICAL ELEMENT

BACKGROUND OF THE INVENTION

1. Field of the Invention

The present invention relates to a process for producing optical elements, specially a process for producing optical elements having refractive index distributions, which may be used for the optical systems of optical instruments such as cameras, duplication machines, optical communication instruments, optical information processing instruments and the like.

2. Description of the Prior Art

The so-call ion exchange method, as disclosed in documents, e.g. Japanese Patent Publication Nos. 816-824/1972, is known as the most common process for producing optical elements having refractive index distributions.

This ion exchange method for producing optical elements comprises thermal diffusion of a suitable species of ions into a base material such as glass so as to distribute the ions in desired concentrations, thereby providing a refractive index distribution in the base material.

The molecular stuffing method is also known as another process for producing optical elements having refractive index distributions. This method comprises filling the fine pores of a porous glass base material with a suitable dopant to distribute it in desired concentrations, thereby providing a refractive index distribution in the porous glass. Japanese Patent Application Laid-Open No.126207/1976 discloses a process for producing a glass product having a refractive index gradient according to the molecular stuffing method.

The ion exchange method, however, is not practical except that monovalent cations having high rates of thermal diffusion are used, in view of mass-productivity since the ion exchange treatment of the base material is time-consuming because of the low rates of thermal diffusion of ions into the base material.

The molecular stuffing method has the advantage of high rates of dopant diffusion into the porous glass and hence a high rate of forming the refractive index distribution. In other words, shorter times are required for the base material treatment with dopants, as compared with the ion exchange method. On the other hand, this method has drawbacks in that the dopant diffusion into the porous glass is difficult to control accurately and hence precise refractive index distribution in the base material is hardly attainable. Another problem in these two conventional methods is that the refractive index distribution can not be formed freely in the base material, because such distribution is brought into existence by diffusion into the base material of the ion or dopant. Hence it is governed solely by the state of diffusion of the ion or dopant.

Japanese Patent Application Laid-Open No.49,639/1983 has disclosed a process for making a pattern of optical property in a flat base plate. Thereby a pattern of optical property is formed in the direction of a surface of a base material.

SUMMARY OF THE INVENTION

In view of the above noted problems, the present invention was made, and the primary object thereof is to provide a process for mass-producing optical elements with high accuracy which have desired optical properties, particularly a certain optical property that continuously changes in the direction perpendicular to the element surface (hereinafter referred to as the thickness direction) or the direction of the optical axis of the element.

In addition, another object of the present invention is to provide a process for efficiently producing optical elements in which change of optical property is formed by using the attenuation of light in the base material.

According to the process of the present invention for producing optical elements, a photo-decomposable compound is introduced into a porous transparent base material, e.g. a porous glass, that is, into the pores of the porous transparent material, to be held therein, and a desired distribution of an optical property is formed by light irradiation. Therefore, a substance controlling an optical property can be incorporated quickly into the base material and accurate formation of optical characteristics has become possible. Thus optical elements having a desired optical property, particularly an optical property changing continuously in the direction of the element thickness or optical axis have become producible with high accuracy and good mass-productivity.

The process for producing optical elements according to the present invention has been accomplished based on the discovery that a continuous optical property change in the direction of light transmission can be produced in such a porous transparent base material by utilizing the transmission-directional attenuation of a light in a porous transparent material such as a porous glass.

Thus, the process for producing optical elements of the present invention comprises the steps of (a) impregnating a porous transparent base material with a photo-decomposable compound which will be decomposed by light irradiation and can make a change in an optical property of the base material in response to the concentration of the photolysis product or compound originated therefrom, and (b) irradiating the resulting base material with rays of light, thereby decomposing this compound in proportion to the exposure quantity decreasing in the light transmission direction, to form a distribution of the concentration of the photolysis product or compound originated therefrom changing in that direction, in the base material.

The process of the invention will be discussed in detail below in connection with the accompanying drawings. In the following description, the process of the invention is illustrated as an embodiment thereof for producing an element in a plate form in which an optical property changes in the thickness direction, by using a porous glass as the porous transparent base material.

DESCRIPTION OF THE PREFERRED EMBODIMENT

Figure 1:
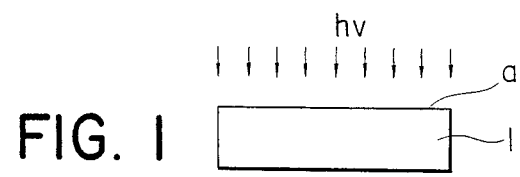
FIGS. 1 and 4 illustrate steps of light exposure in the process of the present invention.

In the process of the invention, the first step is to impregnate the porous glass, used as the base material, with a photo-decomposable compound which will be decomposed by light irradiation and can make a change in an optical property, e.g. the refractive index or optical density, in response to the change in the concentration of the photolysis product or compound originated from this product in the base material.

The term "compound originated from the photolysis product" used herein means a compound resulting from the photolysis product by a chemical change such as decomposition, oxidation, or reduction and an optical property change can be made in the base material according to the distribution of this compound.

The term "optical density" used herein means the degree of light absorption in the glass.

Suitable methods for impregnating a porous glass plate with a photo-decomposable compound include, for example; immersing the porous glass base plate to be treated, in a solution or dispersion, as required, of a photo-decomposable compound in a suitable solvent; sublimating a photo-decomposable compound to introduce it into the pores of the porous glass, provided that the photo-decomposable compound is a solid and stable in the vapor state; impregnating the porous glass with a photo-decomposable compound as such or diluted with a suitable solvent, provided that the photo-decomposable compound is a liquid; and introducing a photo-decomposable compound in vapor form into the pores of the porous glass provided that the photo-decomposable compound is stable in the vapor state.

In this impregnation, treatment conditions such as the concentration of the photo-decomposable compound in the solution, the treatment time and temperature, etc. are properly selected so that a desired distribution of the photolysis product from the photo-decomposable compound, with respect to the thickness direction, will be obtained satisfactorily in the step of irradiating the base material with light described later referring to FIG. 1.

Suitable porous glasses for the base material used in the process of the invention are those having such constituent materials, pore sizes, and porosity as to meet the desired functions of the product optical element, particularly those in which the penetration of the photo-decomposable compound in vapor or solution form is more rapid and this compound or the photolysis product thereof is retained steadily.

When the produced optical element does not exhibit the desired functions on account of the pores remaining in the element, it is possible to eliminate the pores by heating and hardening the porous glass, after completion of the principal steps in the process of the invention, under such conditions that the photolysis product from the photo-decomposable compound or the compound originated from the photolysis product, the former or the latter product controlling the intended optical properties, will be steadily retained in the base material.

The base material is not limited to the porous glass but selected also from ceramic sinters and the like having such porous states as defined above.

The base material made of such a material may have various shapes including not only plate shapes but also disk, prism, and cylinder shapes and additionally shapes provided with various attachments such as parts for fitting the product optical element in a prescribed instrument. These shapes are selected each so as to meet a desired shape of the product optical element.

The photo-decomposable compound to be contained in the base material, i.e. the compound to be introduced into the pores of the porous glass, is preferably such a substance that can be steadily held in the pores of the porous glass, decomposed by light irradiation, can make a change in optical properties, e.g. refractive index and optical density, in response to the distribution of the photolysis product or compound originated therefrom, and can be readily removed therefrom by a simple treatment such as washing with a solvent when the substance has not been decomposed by light and remains in the porous glass. It is also desirable that the photolysis product or compound originated therefrom is steadily retained in the porous glass.

As such photo-decomposable compounds for example, organometallic compounds may be used.

For imparting a refractive index distribution to optical elements, there may be used a photo-decomposable compound containing, for example, Ti, Tl, Pb, Ta, La, Cs, Li, or the like the distribution of which serves to change the refractive indexes to a great extent. Examples of these compounds are $Ti(C_5H_5)_2Cl_2$, $Ti(C_5H_5)_2(CH_3)_2$, $(C_2H_5)_3PbCl$, $(C_6H_5)Tl(C_2H_5)$ and the like. For producing optical elements having optical density distributions, effective photo-decomposable compounds are those containing, for example Co, Fe, Cr, V, Ni, Mn, Cu, Ag, Au or the like. Examples of these compounds are $Co_2(CO)$, $Fe(CO)_5$, $Mn_2(CO)_{10}$ and the like. One or more of the above compounds may be suitably selected for use according to the intended optical function of the product optical element.

The solvent to be used for dissolving or dispersing the photo-decomposable compound and introducing it in the base material is selected properly depending upon the photo-decomposable compound used. It is favorable to choose solvents readily removable from the porous glass. Such solvents include, for example, methylene chloride, ethanol, methanol, n-pentane, tetrahydrofuran and the like.

When the photo-decomposable compound in the form of a solution has been introduced into the base material by impregnation, the base material is degassed and dried by using, e.g. a rotary pump, to remove the solvent from the base material.

The base material in this state is irradiated, as shown in FIG. 1, with uniform and parallel rays from a suitable light source which are incident upon the entire upper surface 'a' of the porous base plate 1.

The light used for this irradiation is of a type capable of decomposing the photo-decomposable compound contained in the base material 1 and having such an intensity and wavelengths that a desired state of exposure quantity attenuation in the direction of light transmission through the base material, i.e. the thickness direction, will be given to the base material in a suitable irradiation time. The light source used for this irradiation is, for example, a mercury lamp, halogen lamp, or krypton laser, with which the irradiation is accomplished under conditions chosen, so as to give such an exposure quantity distribution as stated above, depending upon the photo-decomposable compound and base material used.

Figure 2:
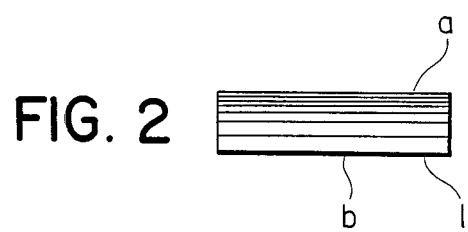
FIG. 2 is a schematic sectional view of an optical element according to the invention, which shows a distribution of the photolysis product concentration.

As shown in FIG. 2, the light, when incident upon the entire upper surface 'a' of the base material 1, attenuates gradually as it proceeds from the upper surface 'a' to the lower surface 'b'. Since the photo-decomposable compound contained in the base material undergoes photolysis in proportion to the exposure quantity, the photolysis product will be distributed in the base material 1 according to the exposure quantity attenuating in the thickness direction, that is to say, the photolysis product distribution will decrease with the distance from the upper surface 'a' toward the lower surface 'b', as shown in the schematic sectional view of FIG. 2.

The plurality of lines in the base material shown in FIG. 2 are drawn each by connecting points of an equal value of the photolysis product concentration which decreases at a definite rate with the distance from the upper surface 'a' of the base material toward the lower surface 'b' thereof.

The base material wherein the concentration of the photolysis product thus distributed decreases in the thickness direction is washed with a solvent, e.g. the same solvent as used before in the solution for the impregnation, whereby the photo-decomposable compound remaining without decomposition can be removed from the base material 1.

Figure 3:
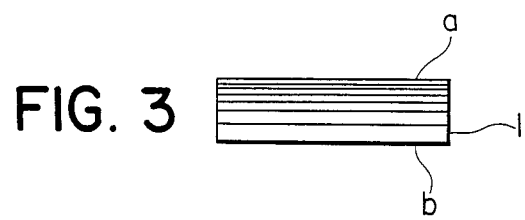
FIGS. 3, 5 and 6 are schematic sectional views of optical elements produced according to the process of the invention.

When the photolysis product is of a nature providing as such the intended optical property to the base material according to the distribution of the product itself, the resulting base material is heated under the temperature and time conditions predetermined as required, thereby being obtainable a nonporous optical element in plate form in which, for example, the refractive index and/or optical density changes in the thickness direction as shown in the schematic sectional view of FIG. 3.

Plural lines in the base meterial shown in FIG. 3 are drawn each by connecting points of an equal value of, e.g. the refractive index which decreases at 'a' definite rate with the distance from the upper surface 'a' of the base material toward the lower surface 'b' thereof.

On the other hand, when the compound originated from the photolysis product is of a nature, as stated above, providing the intended optical property to the base material, the resulting base material 1 is treated for causing the photolysis product to further undergo a chemical change such as decomposition, oxidation, or reduction, thereby forming a distribution of the compound originated from the photolysis product, according to the decreasing exposure quantity stated above. In addition, the base material is heated under the temperature and time conditions predetermined as required, thereby being obtainable a nonporous optical element in plate form in which, for example, the refractive index changes in the thickness direction.

Figure 4:
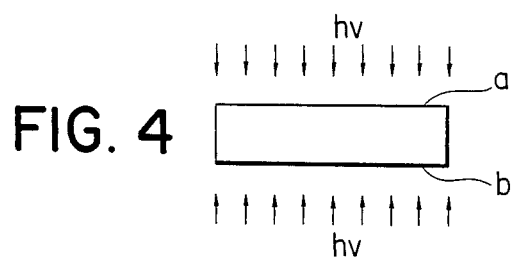
Figure 5:
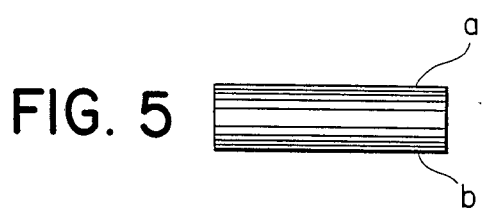

While the light irradiation in the exposure step shown in FIG. 1 is carried out with rays incident upon the upper surface 'a' of the base plate, the irradiation in the present invention is not limited to this but may be carried out with rays incident upon two or more sides of the base material 1. For instance in the production of an optical element having a refractive index distribution, the exposure is conducted with rays incident upon both the upper surface 'a' and the lower surface 'b' which face each other as shown in FIG. 4, thereby being producible an optical element wherein the refractive index decreases, as shown in FIG. 5, in the directions from both the upper surface 'a' and the lower surface 'b' toward the central horizontal plane where the refractive index becomes minimum. The lines drawn in the base material shown in FIG. 5 are similar to those shown in FIG. 3 but the refractive index, for example, is minimum, in FIG. 5, at the central horizontal plane.

While the exposure in the above embodiments of the invention is carried out with a light beam uniform in intensity in the directions parallel to the base material surface, it is possible by varying the light intensity in said direction to form in base materials various three-dimensional distributions of, for example, refractive index which are dependent upon the pattern of the intensity variation and additionally upon the exposure quantity attenuation in the thickness direction.

Moreover, in the process of the invention, a desired optical property can be provided to the optical element by suitable selection of (1) various treatment conditions for introducing the photodecomposable compound into the pores of the porous glass according to the nature of the photo-decomposable compound and the nature and shape of the base material, and (2) various operation conditions such as the type of light for irradiation, the surface(s) where the irradiation light enters, and the exposure time, and by making the optical element according to the procedure described above. If the photodecomposable compound is susceptible to oxidation under various operation conditions in the above steps, the operations in the steps may be conducted in an inert atmosphere.

Figure 6:

Furthermore, the thus prepared optical element can be formed into various desired shapes, for instance, the upper surface 'a' is modified into spherical form as shown in FIG. 6.

The process of the present invention is illustrated in more detail with reference to the following examples.

When using in practice the optical elements produced in accordance with the process of the present invention, the difference between the maximum and minimum values of refractive index in the direction of light transmission on producing the optical elements is preferably 0.001 or more, more preferably 0.01 or more.

EXAMPLE 1

A plate ($10 \times 10 \times 3$ mm) of porous glass (#7930, supplied by Corning Co,) as a base material was immersed in an 0.03 mol/l solution of titanothene chloride ($Ti(C_5H_5)_2Cl_2$) in $CH_2Cl_2$ at 20° C. for 2 hours. This immersion treatment caused the solution to penetrate uniformly into the entire inside region of the porous glass plate and turned the plate dark red.

Then the plate was degassed and dried by using a rotary pump to remove the solvent ($CH_2Cl_2$) present in the pores of the porous glass from the plate.

The degassed and dried plate was irradiated for 2 hours with a uniform beam of ultraviolet rays incident upon the upper surface of the plate by using a high-pressure mercury lamp (supplied by UshioDenki Co., Ltd.). In this case the exposure quantity attenuated gradually with the distance from the upper surface of the plate toward the lower surface. This irradiation turned the color of the plate from dark red to pale orange.

At this time, $Ti(C_5H_5)_2Cl_2$ contained in the pores of the porous glass underwent the following decomposition reaction:

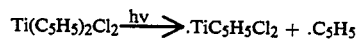

The thus produced $TiC_5H_5Cl_2$ radicals, in the presence of a halogen-containing compound, e.g. $CH_2Cl_2$, convert immediately into $TiC_5H_5Cl_3$, but in porous glass they react with silanol groups (—Si—OH) present on the inside walls of the porous glass cells, and are fixed there and thereabouts.

After this exposure, the plate was washed with $CH_2Cl_2$ to remove $Ti(C_5H_5)_2Cl_2$ remaining therein without decomposition from the inside of the plate. In the washed plate, the above-mentioned Ti-containing photolysis product is distributed in proportion to the distribution of exposure quantity.

Then the plate was heated at 700° C. for 30 minutes to oxidize—$TiC_5H_5Cl_2$; coupled with the glass into—$TiO_2$ and remove the chlorine and organic compound remaining in the plate therefrom, giving an optical element having a refractive index distribution. That is, —$TiO_2$ was distributed in the element in response to the exposure quantity attenuating in the direction of the base plate thickness during the irradiation, thus resulting in the refractive index distribution according to the—$TiO_2$ distribution.

In the thus obtained optical element, the refractive index decreases nearly exponentially with the distance from the upper surface (the surface where the light entered) toward the lower surface and the maximum difference in refractive index was about 0.02.

For the purpose of improving weather resistance of the obtained optical element, the element was further heated at 1000° C. for 5 hours to eliminate the pores of the porous glass.

One side and both sides of optical elements produced in the above illustrated manner were polished to spherical and non-spherical forms, making so-called axial gradient lenses. These lenses were of great utility for aberration corrections in optical systems.

EXAMPLE 2

Optical elements having a refractive index distribution were produced in the same manner as in Example 1 except that the exposure light was incident upon both sides of each base plate.

In the thus produced optical elements, the refractive index decreases in the directions from both the upper and lower surfaces toward the center plane parallel to the surfaces and becomes minimum at this center plane. The refractive index difference between the maximum and minimum values was 0.001.

I claim:

1. A process for producing an optical element comprising the steps of (a) impregnating a porous transparent base material having an optical property with a photo-decomposable compound to form an impregnated base material, and (b) irradiating in at least one direction the impregnated base material with light rays to expose the photo-decomposable compound to quantities of light of decreasing intensity in the direction of the irradiating light rays, thereby decomposing the photo-decomposable compound to form a photolysis compound in a distribution decreasing in the direction of the irradiating light rays; said distribution of the photolysis compound being capable of altering said optical property of the base material.

2. A process according to claim 1, wherein the irradiating step is performed using parallel light rays.

3. A process according to claim 1, wherein the impregnating step is performed with the photo-decomposable compound in vapo form.

4. A process according to claim 1, further comprising (c) heating the porous base material to eliminate the pores.

5. A process according to claim 1, wherein the irradiating step radiates the material in at least two directions.

6. A process according to claim 5, wherein the two directions are opposite each other.

7. A process according to claim 1, wherein the irradiating step varies the radiation intensity across the surface of the base material.

8. A process according to claim 1 wherein the base material is a porous glass.

9. A process according to claim 1, wherein the optical property is refractive index.

10. A process according to claim 9, wherein the photo-decomposable compound is an organometallic compound.

11. A process according to claim 9, wherein the photo-decomposable compound comprises at least one element selected from the group consisting of Ti, Tl and Pb.

12. A process according to claim 9, wherein the photo-decomposable compound is a member selected from the group consisting of $Ti(C_5H_5)_2Cl_2$, $Ti(C_5H_5)_2(CH_3)_2$, $(C_2H_5)_3PbCl$, $(C_6H_5)Tl(C_2H_5)$, and mixtures thereof.

13. A process according to claim 4, wherein the photo-decomposable compound comprises at least one element selected from the group consisting of Ta, La, Cs and Li.

14. A process according to claim 1, wherein the optical property is the optical density.

15. A process according to claim 14, wherein the photo-decomposable compound is an organometallic compound.

16. A process according to claim 14, wherein the photo-decomposable compound comprises at least one element selected from the group consisting of Co, Fe 17. A process according to claim 16, wherein the photo-decomposable compound is a member selected from the group consisting of $Co_2(CO)$, $Fe(CO)_5$, $Mn_2(CO)_{10}$, and mixtures thereof.

18. A process according to claim 14, wherein the photo-decomposable compound comprises at least one element selected from the group consisting of Cr, V, Ni, Cu, Ag and Au.

19. A process according to claim 1, wherein the impregnating step is performed by immersing the base material in a solution or dispersion of the photo-decomposable compound in a solvent.

20. A process according to claim 1, wherein the process is carried out in an inert atmosphere.

21. A process for producing an optical element comprising the steps of (a) impregnating a porous transparent base material having an optical property with a photo-decomposable compound to form an impregnated base material, (b) irradiating in at least one direction the impregnated base material with light rays to expose the photo-decomposable compound to quantities of light of decreasing intensity in the direction of the irradiating light rays, thereby decomposing the photo-decomposable compound to form a photolysis compound in a distribution decreasing in the direction of the irradiating light ray; (c) removing from the base material the non-decomposed photo-decomposable compound remaining after the irradiating with light rays step; and (d) heating the impregnated base material to cause the photolysis compound to chemically change and to form a compound originated from the photolysis compound in a distribution the same as the distribution of the photolysis compound, said distribution of the compound originated from the photolysis compound being capable of altering said optical property of the base material.

22. A process according to claim 21, wherein the base material is a porous glass.

23. A process according to claim 21, wherein the irradiating step is performed using parallel light rays.

24. A process according to claim 21, wherein the optical property is refractive index.

25. A process according to claim 24, wherein the photo-decomposable compound comprises at least one element selected from the group consisting of Ta, La, Cs and Li.

26. A process according to claim 24, wherein the photo-decomposable compound is an organometallic compound.

27. A process according to claim 24, wherein the photo-decomposable compound comprises at least one element selected from the group consisting of Ti, Tl and Pb.

28. A process according to claim 27, wherein the photo-decomposable compound is a compound selected from the group consisting of $Ti(C_5H_5)_2Cl_2$, $Ti(C_5H_5)_2(CH_3)_2$, $(C_2H_5)_3PbCl$, $(C_6H_5)Tl(C_2H_5)$, and mixtures thereof.

29. A process according to claim 21, wherein the optical property is the optical density.

30. A process according to claim 29, wherein the photo-decomposable compound is an organometallic compound.

31. A process according to claim 30, wherein the photo-decomposable compound comprises at least one element selected from the group consisting of Co, Fe and Mn.

32. A process according to claim 31, wherein the photo-decomposable compound is a compound selected from the group consisting of $Co_2(CO)$, $Fe(CO)_5$, $Mn_2(CO)_{10}$, and mixtures thereof.

33. A process according to claim 30, wherein the photo-decomposable compound comprises at least one element selected from the group consisting of Cr, V, Ni, Cu, Ag and As.

34. A process according to claim 21, wherein the impregnating step is performed by immersing the base material in a solution or dispersion of the photo-decomposable compound in a solvent.

35. A process according to claim 21, wherein the impregnating step is performed with the photo-decomposable compound in a vapor form.

36. A process according to claim 21, wherein the removing from the base material of the non-decomposed photo-decomposable compound remaining after the light irradiation is by using a solvent.

37. A process according to claim 36, further comprising (e) heating the porous base material to eliminate the pores.

38. A process according to claim 21, further comprising (e) heating the porous base material to eliminate the pores.

39. A process according to claim 21, wherein the irradiating step irradiates the material in at least two directions.

40. A process according to claim 39, wherein the two directions are opposite each other.

41. A process according to claim 21, wherein the irradiating step varies the radiation intensity across a surface of the base material.

42. A process according to claim 21, wherein the process is carried out in an inert atmosphere

* * * * *